United States Patent
Na et al.

(10) Patent No.: US 9,410,237 B2
(45) Date of Patent: Aug. 9, 2016

(54) THIN FILM DEPOSITION APPARATUS

(71) Applicant: SAMSUNG DISPLAY CO., LTD., Yongin, Gyeonggi-Do (KR)

(72) Inventors: HeungYeol Na, Yongin (KR); Jae hong Ahn, Yongin (KR); Wonsik Hyun, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 197 days.

(21) Appl. No.: 14/018,701

(22) Filed: Sep. 5, 2013

(65) Prior Publication Data

US 2014/0299060 A1   Oct. 9, 2014

(30) Foreign Application Priority Data

Apr. 5, 2013 (KR) .................. 10-2013-0037596

(51) Int. Cl.
    *C23C 14/24*    (2006.01)
(52) U.S. Cl.
    CPC .................................. *C23C 14/243* (2013.01)
(58) Field of Classification Search
    CPC ...... C23C 14/24; C23C 14/243; C23C 14/246
    USPC ................................................ 118/726, 727
    See application file for complete search history.

(56) References Cited

U.S. PATENT DOCUMENTS

| 4,613,306 | A | * | 9/1986 | Bauer et al. | 432/264 |
| 4,828,872 | A | * | 5/1989 | Bauer et al. | 427/566 |
| 5,951,769 | A | * | 9/1999 | Barnard et al. | 118/718 |
| 2005/0016463 | A1 | * | 1/2005 | Hirano | 118/726 |

FOREIGN PATENT DOCUMENTS

| KR | 20-0379129 Y1 | 3/2005 |
| KR | 10-2006-0086511 A | 8/2006 |

* cited by examiner

*Primary Examiner* — Keath Chen
*Assistant Examiner* — Aiden Lee
(74) *Attorney, Agent, or Firm* — Lee & Morse, P.C.

(57) ABSTRACT

A thin film deposition apparatus includes a vacuum chamber, a substrate supporter disposed in the vacuum chamber to support a target substrate on which a thin film is deposited, and a deposition source that evaporates a deposition material and supplies the evaporated deposition material to the target substrate. The deposition source includes a crucible that includes a deposition material-containing portion to accommodate the deposition material and a first flange at an upper end of the deposition material-containing portion, a spray nozzle that includes a spray portion through which the evaporated deposition material is sprayed and a second flange at a lower end of the spray portion to make contact with the first flange, and a cooling member attached to an outer surface of the first flange and the second flange.

9 Claims, 7 Drawing Sheets

THIN FILM DEPOSITION APPARATUS

CROSS-REFERENCE TO RELATED APPLICATION

Korean Patent Application No. 10-2013-0037596, filed on Apr. 5, 2013, in the Korean Intellectual Property Office, and entitled: "Thin Film Deposition Apparatus," is incorporated by reference herein in its entirety.

BACKGROUND

1. Field

Embodiments relate to a thin film deposition apparatus.

2. Description of the Related Art

In general, an organic light emitting display device injects holes and electrons into a light emitting layer through an anode electrode and a cathode electrode, respectively, and the holes and the electrons are recombined in the light emitting layer to generate excitons (electron-hole pairs). The excitons emit energy, which is discharged when an excited state returns to a ground state, as light.

The light emitting layer includes at least one organic thin film, and each of the anode electrode and the cathode electrode has a conductive thin film structure.

Meanwhile, the organic thin film and the conductive thin film are formed by a physical vapor deposition (PVD) method, e.g., an evaporation deposition method, an ion plating method, a sputtering method, etc., or a chemical vapor deposition (CVD) method using a gas reaction.

SUMMARY

Embodiments are directed to a thin film deposition apparatus including a vacuum chamber, a substrate supporter disposed in the vacuum chamber to support a target substrate on which a thin film is deposited, and a deposition source that evaporates a deposition material and supplies the evaporated deposition material to the target substrate. The deposition source includes a crucible, a spray nozzle, and a cooling member. The crucible includes a deposition material-containing portion to accommodate the deposition material and a first flange at an upper end of the deposition material-containing portion. The spray nozzle includes a spray portion through which the evaporated deposition material is sprayed and a second flange at a lower end of the spray portion to make contact with the first flange. The cooling member is attached to an outer surface of the first flange and the second flange.

One of the first flange and the second flange may include a plurality of convex portions. The other one of the first flange and the second flange may include a plurality of concave portions. Each of the convex portions may be inserted into a corresponding concave portion of the concave portions.

The cooling member may be a Peltier-effect device.

The thin film deposition apparatus may further include a heating member to heat the deposition material-containing portion.

The thin film deposition apparatus further includes a deposition plate at a lower portion in the vacuum chamber. The deposition source may be placed on the deposition plate.

The thin film deposition apparatus may further include an insulation member that wraps the deposition source.

Embodiments are also directed to a thin film deposition apparatus including a vacuum chamber, a substrate supporter in the vacuum chamber to support a target substrate on which a thin film is deposited, and a deposition source that evaporates a deposition material and supplies the evaporated deposition material to the target substrate. The deposition source includes a crucible and a spray nozzle. The crucible includes a deposition material-containing portion to accommodate the deposition material and a first flange at an upper end of the deposition material-containing portion. The spray nozzle includes a spray portion through which the evaporated deposition material is sprayed and a second flange at a lower end of the spray portion to make contact with the first flange. A length of a leakage path defined between the first flange and the second flange, into which the deposition material partially enters and through which the entered deposition material moves, is longer than a distance in a width direction between an interior of the deposition source and ends of the first flange and the second flange.

One of the first flange and the second flange may include a plurality of convex portions. The other one of the first flange and the second flange may include a plurality of concave portions. Each of the convex portions may be inserted into a corresponding concave portion of the concave portions.

The thin film deposition apparatus may further including a cooling member attached to an outer surface of the first flange and the second flange.

The cooling member may be a Peltier-effect device.

The thin film deposition apparatus may further include an insulation member that wraps the deposition source.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
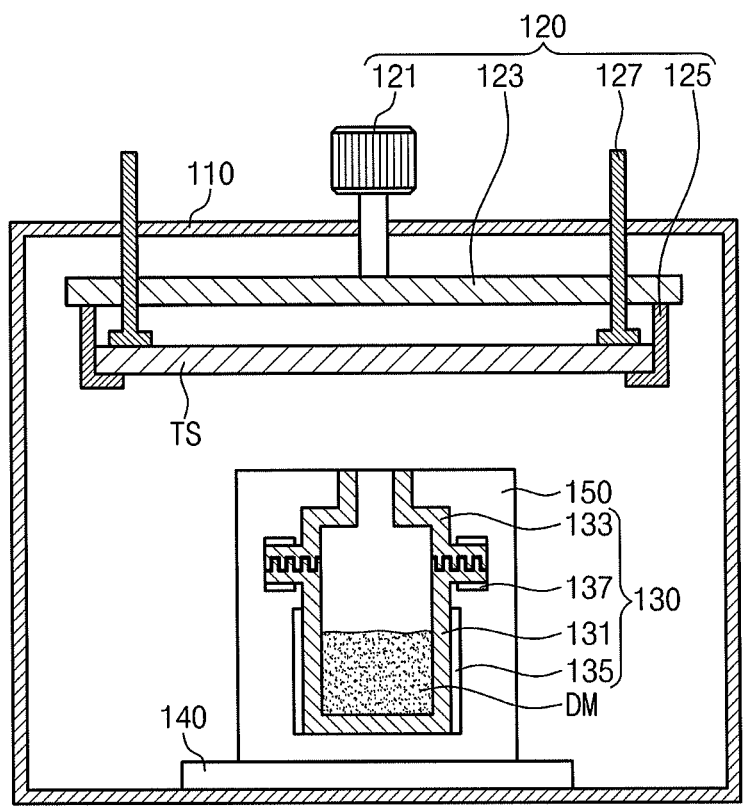
FIG. 1 illustrates a view showing a thin film deposition apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiment will be explained in detail with reference to the accompanying drawings.

Figure 2:
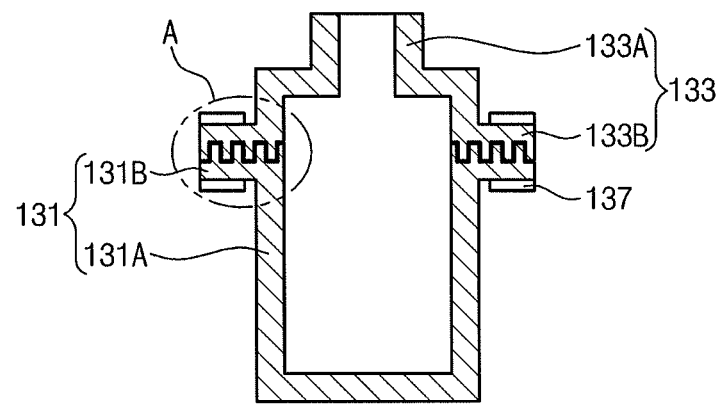
FIG. 2 illustrates a cross-sectional view showing a coupling structure between a crucible and a spray nozzle shown in FIG. 1.
Figure 3:
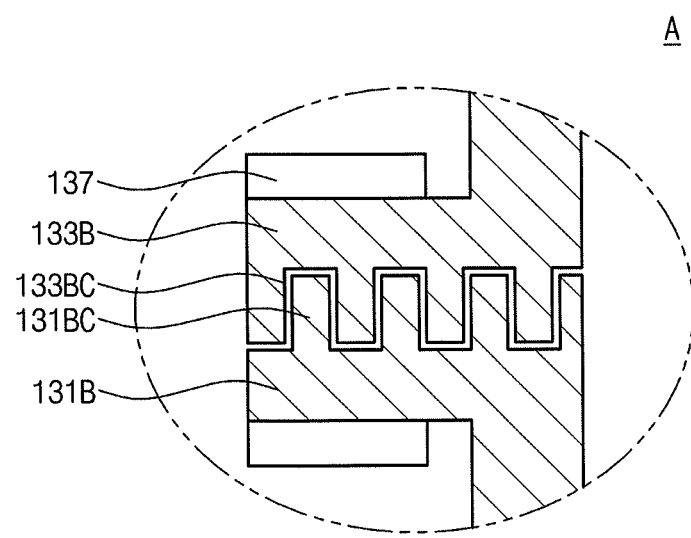
FIG. 3 illustrates a partially enlarged view showing a portion A shown in FIG. 2.

FIG. 1 illustrates a view showing a thin film deposition apparatus according to an exemplary embodiment, FIG. 2 is a cross-sectional view showing a coupling structure between a crucible and a spray nozzle shown in FIG. 1, and FIG. 3 is a partially enlarged view showing a portion A shown in FIG. 2.

Referring to FIGS. 1 to 3, the thin film deposition apparatus may include a vacuum chamber 110 that maintains an inner space thereof in a vacuum state, a substrate supporter 120 disposed in the vacuum chamber 110 to support a target substrate TS on which a thin film is deposited, and a deposition source 130 that supplies a deposition material DM to the target substrate TS.

The target substrate TS, on which a thin film is formed using the thin film deposition apparatus, may be, for example, a thin film transistor substrate on which a pixel electrode (not shown) is formed. In addition, the target substrate TS may be divided into pixel areas (not shown) that display different colors.

The vacuum chamber 110 may serve as a body of the thin film deposition apparatus and provides a receiving space to accommodate the substrate supporter 120 and the deposition source 130.

The substrate supporter 120 may include a substrate rotation member 121 to rotate the target substrate TS, a substrate support member 123 connected to the substrate rotation member 121, a substrate holder 125 disposed at both ends of the substrate support member 123 to hold the target substrate TS, and a substrate fixing member 127 facing the substrate holder 125 to fix the target substrate TS to the substrate holder 125. In the present exemplary embodiment, the substrate fixing member 127 is connected to an external driving device (not shown), and thus the substrate fixing member 127 may move upwardly and downwardly.

The deposition source 130 may be disposed on a separate deposition plate 140 disposed in the vacuum chamber 110 to face the target substrate TS in the vacuum chamber 110. The deposition source 130 may include a crucible 131, a spray nozzle 133, a heating member 135, and a cooling member 137 to cool a coupled portion between the crucible 131 and the spray nozzle 133.

The crucible 131 may be formed of a metal material or a conductive ceramic material. The crucible 131 may accommodate the deposition material DM therein and may evaporate the deposition material DM. In addition, the crucible 131 may include a deposition material-containing portion 131A to accommodate the deposition material DM and a first flange 131B bent at and extended from an upper end portion of the deposition material-containing portion 131A. The first flange 131B may be coupled to the spray nozzle 133. Further, the first flange 131B may include a plurality of convex portions 131BC. Each convex portion 131BC may have a rectangular shape when viewed in a cross section, as an example.

The deposition material DM may contain an evaporable material used to form a light emitting layer or a conductive layer of an organic light emitting display device.

The spray nozzle 133 may be coupled to the crucible 131 and may spray the deposition material DM evaporated in the crucible 131 to the vacuum chamber 110. The spray nozzle 133 may include a spray portion 133A through which the evaporated deposition material DM is sprayed and a second flange 133B bent at and extended from a lower end portion of the spray portion 133A. The second flange 133B may make contact with the first flange 131B. The second flange 133B may include a plurality of concave portions 133BC corresponding to the convex portions 131BC, respectively, as shown in FIG. 3. That is, the concave portions 133BC may have shapes corresponding to those of the convex portions 131BC to accommodate the convex portions 131BC. For instance, each concave portion 133BC may have a rectangular shape when viewed in a cross section.

Thus, the crucible 131 and the spray nozzle 133 may be coupled to each other by the convex portions 131BC and the concave portions 133BC being coupled with each other, and thus, an area of a contact surface between the first flange 131B and the second flange 133B may be increased.

In addition, a length of a leakage path formed between the first and second flanges 131B and 133B becomes longer due to the coupling structure between the first and second flanges 131B and 133B. Thus, although the deposition material DM evaporated in the crucible 131 may enter into the leakage path formed between the first flange 131B and the second flange 133B, it may be difficult for the deposition material DM to leak to the outside of the deposition source 130 after passing through the longer leakage path formed between the first and second flanges 131B and 133B due to the coupling structure between the first and second flanges 131B and 133B.

The heating member 135 may heat the crucible 131 at the outside of the crucible 131 to evaporate the deposition material DM contained in the crucible 131. For example, the heating member 135 may heat the crucible 131 using an electron beam or a resistive heating method.

The cooling member 137 is attached to an outside outer surface of the first flange 131B and the second flange 133B. Accordingly, the cooling member 137 may cool the deposition material that enters into the leakage path formed between the first and second flanges 131B and 133B to prevent or reduce the likelihood of the deposition material DM being leaked through other portions of the deposition source 130 except for the spray nozzle 133.

The cooling member 137 may be, for example, a Peltier-effect device. The Peltier-effect device is an electric cooling device using a Peltier effect. In general, the Peltier-effect device includes an n-type semiconductor layer and a p-type semiconductor layer, each including an alloy made from the elements of group V-VI and a solid solution thereof, and a metal plate having electric and heat conductivity to connect the n-type semiconductor layer and the p-type semiconductor layer. Here, the term of "Peltier effect" used herein denotes that heat radiation and heat absorption occur in the junction portion between different conductors (metal or semiconductor), except for Joule's heat, when a current flows through the different conductors junctioned at any one point. The heat quantity depending on the current may be different according to different materials used.

The deposition source 130 may be wrapped by an insulation member 150. The insulation member 150 may prevent the heat generated by the heating member 135 from being discharged from the inside of the deposition source 130 of the vacuum chamber 110.

Hereinafter, an operation of the thin film deposition apparatus will be described in detail with reference to FIGS. 4 and 5.

Figure 4:
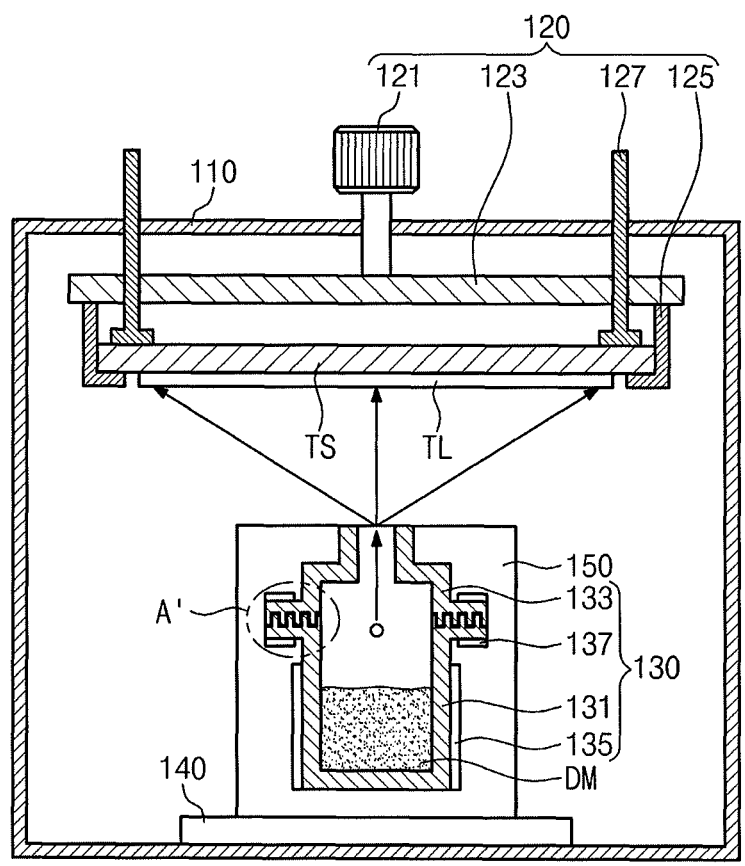
FIG. 4 illustrates a view explaining an operation of the thin film deposition apparatus shown in FIG. 1.
Figure 5:
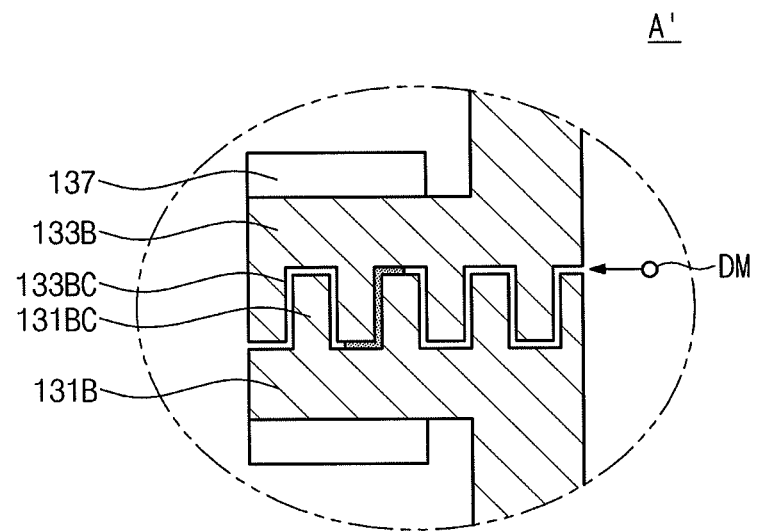
FIG. 5 illustrates a partially enlarged view showing a portion A' shown in FIG. 4.

FIG. 4 illustrates a view explaining the operation of the thin film deposition apparatus shown in FIG. 1 and FIG. 5 is a partially enlarged view showing a portion A' shown in FIG. 4.

Referring to FIGS. 4 and 5, the target substrate TS is disposed in the vacuum chamber 110. The target substrate TS is disposed on the substrate supporter 120. In detail, when the substrate fixing member 127 moves upwardly and downwardly after the target substrate TS is disposed on the substrate support member 123, the target substrate TS is fixed to the substrate holder 125.

After the target substrate TS is mounted on the substrate supporter 120, the crucible 131 of the deposition source 130 is heated using the heating member 135. The deposition material DM in the crucible 131 is evaporated by the heat generated by the heating member 135. In the present exemplary embodiment, the deposition material DM may be an organic material or a conductive material.

The evaporated deposition material DM may be sprayed through the spray portion 133A of the spray nozzle 133. The sprayed deposition material DM may be supplied to the target substrate TS to form a thin film TL on the target substrate TS. The thin film TL may be an organic material or a conductive layer, according to the deposition material DM.

In addition, a portion of the evaporated deposition material DM may enter into the leakage path formed between the first flange 131B and the second flange 133B, by which the crucible 131 and the spray nozzle 133 are coupled to each other, without being sprayed through the spray portion 133A.

The deposition material DM may enters into between the first and second flanges 131B and 133B may be cooled by the cooling member 137 attached to the outside outer surface of the first and second flanges 131B and 133B. Therefore, a space between the first and second flanges 131B and 133B may be sealed by the cooled deposition material DM. As a result, the deposition material DM may be prevented from being leaked through the leakage path formed between the crucible 131 and the spray nozzle 133.

In addition, the first flange 131B and the second flange 133B may include the convex portions 131BC and the concave portions 133B, respectively. Accordingly, a length of the leakage path through which the deposition material DM that has entered into the space between the first and second flanges 131B and 133B must move in order to leak outside the deposition source 130 may be increased.

The length of the leakage path in which the deposition material DM must move to order to leak to the outside of the deposition source 130 is longer than a distance in a width direction between the interior of the deposition source and ends of the first and second flanges 131B and 133B. Thus, it is difficult for the deposition material DB to leak to the outside of the deposition source 130 by passing through the leakage path formed between the first and second flanges 131B and 133B.

Figure 6:
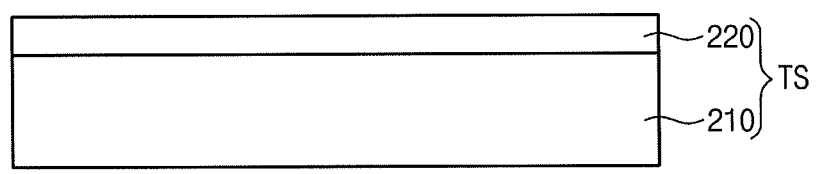
FIGS. 6 to 8 illustrate views explaining stages of a method of manufacturing an organic light emitting display device using the thin film deposition apparatus shown in FIGS. 1 to 5.
Figure 7:
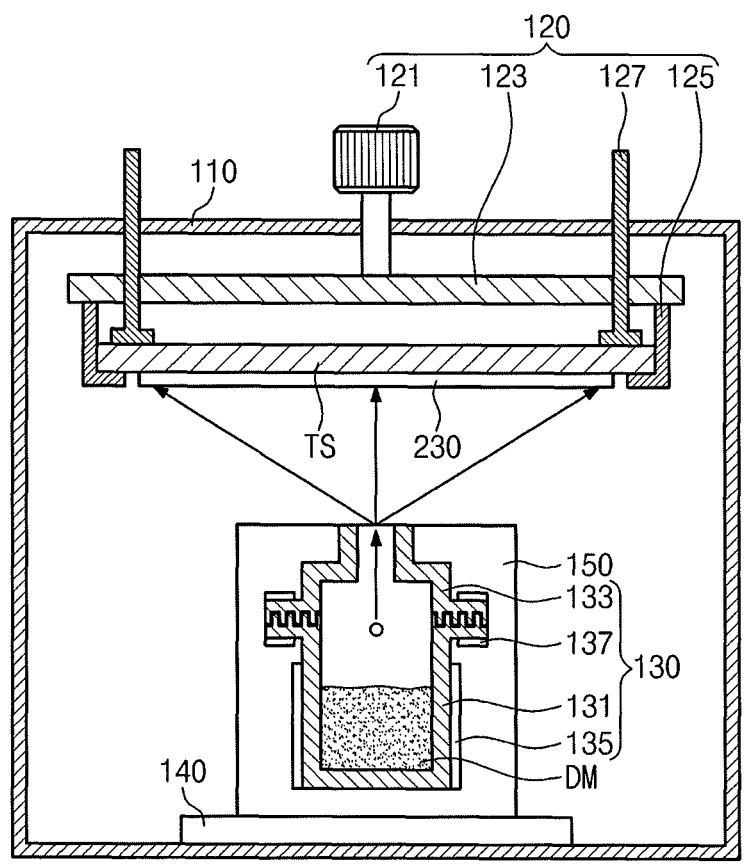
Figure 8:
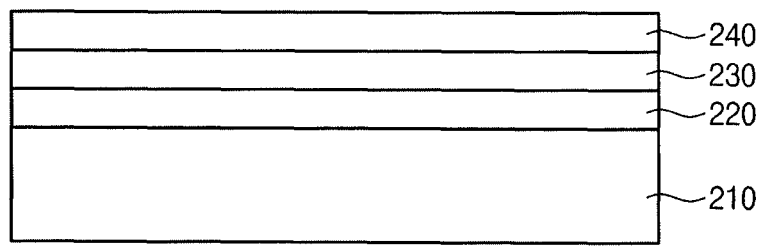

FIGS. 6 to 8 illustrate views explaining stages of a method of manufacturing an organic light emitting display device using the thin film deposition apparatus shown in FIGS. 1 to 5. Hereinafter, for the convenience of explanation, a light emitting layer of the organic light emitting display device will be described as a thin film formed in the thin film deposition apparatus, as a representative example.

Referring to FIG. 6, the target substrate TS is prepared. The target substrate TS may include a thin film transistor substrate 210 and a first electrode 220 disposed on the thin film transistor substrate 210.

The thin film transistor 210 may include a plurality of pixel areas (not shown) and at least one thin film transistor (not shown) may be disposed in each pixel area.

The first electrode 220 may include a conductive material and may be connected to the thin film transistor. For instance, the first electrode 220 may include a transparent conductive oxide with a high work function. The transparent conductive oxide may include indium tin oxide (ITO), indium zinc oxide (IZO), aluminum zinc oxide (AZO), gallium-doped zinc oxide (GZO), zinc tin oxide (ZTO), gallium tin oxide (GTO), or fluorine-doped tin oxide (FTO).

Although not shown in figures, the target substrate TS may further include a pixel definition layer to expose the pixel areas.

Referring to FIG. 7, after the target substrate TS is prepared, the organic layer 230 may be formed on the first electrode 220 using the thin film deposition apparatus shown in FIGS. 1 to 5.

In detail, the target substrate TS may be disposed on the substrate supporter 120 of the thin film deposition apparatus. Then, the crucible 131 of the deposition source 130 may be heated to evaporate the deposition material DM in the crucible 131. Here, the deposition material DM may be an organic material for the organic light emitting display device.

The evaporated deposition material DM is mostly sprayed out through the spray portion 133A of the spray nozzle 133. The sprayed deposition material DM is supplied to the target substrate TS to form the organic layer 230 on the target substrate TS.

A portion of the evaporated deposition material DM may enter into between the first flange 131B and the second flange 133B, in which the crucible 131 and the spray nozzle 133 are coupled to each other, without being sprayed through the spray portion 133A.

The deposition material DM that enters between the first and second flanges 131B and 133B may be cooled by the cooling member 137 attached to the outside outer surface of the first and second flanges 131B and 133B. Therefore, the space between the first and second flanges 131B and 133B may be sealed by the cooled deposition material DM. As a result, the deposition material DM may be prevented or hindered from being leaked to the outside between the crucible 131 and the spray nozzle 133.

The organic layer 230 formed by the thin film deposition apparatus may include at least the light emitting layer and may have a multi-layer structure. For instance, the organic layer 230 may include a hole injection layer that injects holes, a hole transport layer that controls movement of electrons, which are not combined with the holes in the light emitting layer, to enhance an opportunity of recombination between the holes and electrons, the light emitting layer, which emits light according to the recombination between the holes and electrons that are injected into the light emitting layer, a hole blocking layer that controls movement of the holes not recombined with the electrons in the light emitting layer, an electron transport layer that transports the electrons to the light emitting layer, and an electron injection layer that injects the electrons.

Referring to FIG. 8, a second electrode 240 may be formed on the organic layer 230 after the organic layer 230 is formed.

The second electrode 240 may include a material with a low work function when compared to the material of the first electrode 220. As an example, the second electrode 240 may include at least one of Mo, W, Ag, Mg, Al, Pt, Pd, Au, Ni, Nd, Ir, Cr, Li, Ca, or an alloy thereof.

After the second electrode 240 is formed, a conductive layer (not shown) may be formed on the second electrode 240 in order to prevent an IR drop of the second electrode 240.

Then, a sealing process is performed, and thus the organic light emitting display device is manufactured.

Figure 9:
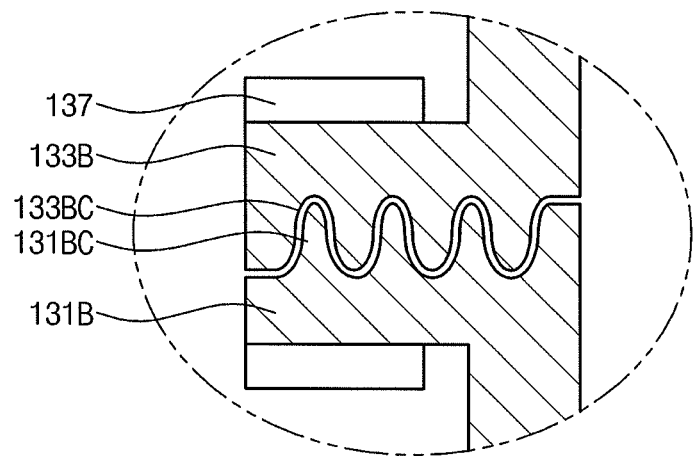
FIGS. 9 to 11 illustrate enlarged cross-sectional views showing various examples of the coupling structure between the crucible and the spray nozzle.
Figure 10:
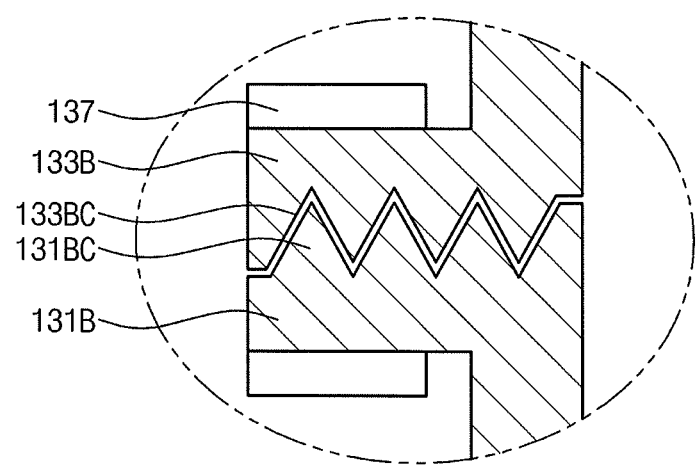
Figure 11:
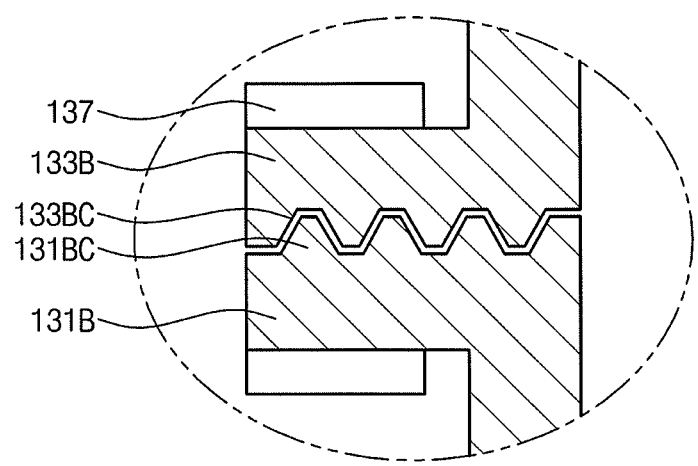

FIGS. 9 to 11 illustrate enlarged cross-sectional views showing various examples of the coupling structure between the crucible and the spray nozzle.

Referring to FIGS. 9 to 11, the first flange 131B of the crucible 131 is coupled to the second flange 133B of the spray nozzle 133 to make contact with each other. In addition, one of the first and second flanges 131B and 133B, e.g., the first flange 131B, may include the convex portions 131BC, and the other one of the first and second flanges 131B and 133B, e.g., the second flange 133B, may include the concave portions 133BC.

The convex portions 131BC may have various shapes when viewed in a cross section. In addition, the concave portions 133BC may have various shapes to accommodate the convex portions 131BC.

For example, the convex portions 131BC may have a wave shape when viewed in a cross section as shown in FIG. 9. Similarly, the concave portions 133BC may have the wave shape when viewed in a cross section to be coupled to the convex portions 131BC.

In another implementation, the convex portions 131BC may have a triangular shape when viewed in a cross section as shown in FIG. 10. Similarly, the concave portions 133BC may have the triangular shape when viewed in a cross section to be coupled to the convex portions 131BC.

In another implementation, the convex portions 131BC may have a trapezoid shape when viewed in a cross section as shown in FIG. 11. Similarly, the concave portions 133BC may have the trapezoid shape when viewed in a cross section to be coupled to the convex portions 131BC.

By way of summation and review, an evaporation deposition method may be performed using a deposition source provided with a crucible and a spray nozzle. However, a deposition material may leak between the crucible and the spray nozzle. When the deposition material leaks, an inner pressure of the deposition source may become non-uniform, and thus the deposition material may be non-uniformly sprayed out through the spray nozzle. As a result, a thickness of the thin film formed on a target substrate may not be uniform due to the leakage of the deposition material between the crucible and the spray nozzle.

Embodiments provide a thin film deposition apparatus that may prevent or hinder a deposition material from being leaked. The thin film formed by the thin film deposition apparatus may have a uniform thickness.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. A thin film deposition apparatus, comprising:
a vacuum chamber;
a substrate supporter in the vacuum chamber to support a target substrate on which a thin film is deposited; and
a deposition source that evaporates a deposition material and supplies the evaporated deposition material to the target substrate, the deposition source including:
a crucible that includes a deposition material-containing portion to accommodate the deposition material and a first flange, the first flange being an extended portion of the crucible that extends away from an outer wall of the deposition material containing portion at an upper end of the deposition material-containing portion;
a spray nozzle that includes a spray portion through which the evaporated deposition material is sprayed and a second flange, the second flange being an extended portion of the spray nozzle that extends away from an outer wall of the spray portion at a lower end of the spray nozzle to make contact with the first flange;
wherein:
one of the first flange and the second flange includes a plurality of convex portions, the other one of the first flange and the second flange includes a plurality of concave portions, and the plurality of convex portions and the plurality of concave portions being consecutively positioned in an entire width direction between an interior of the deposition source and ends of the first flange and the second flange, and each of the convex portions being inserted into a corresponding concave portion, and
a cooling member attached to an outer surface of the first flange and the second flange away from the deposition material containing portion and the spray portion along a leakage path of the first and second flange to cool deposition material that partially enters the leakage path, the leakage path being defined between the first flange and the second flange.

2. The thin film deposition apparatus as claimed in claim 1, wherein the cooling member is a Peltier-effect device.

3. The thin film deposition apparatus as claimed in claim 1, further including a heating member to heat the deposition material-containing portion.

4. The thin film deposition apparatus as claimed in claim 1, further including a deposition plate at a lower portion in the vacuum chamber, wherein the deposition source is placed on the deposition plate.

5. The thin film deposition apparatus as claimed in claim 1, further including an insulation member that wraps the deposition source.

6. A thin film deposition apparatus comprising:
a vacuum chamber;
a substrate supporter in the vacuum chamber to support a target substrate on which a thin film is deposited; and
a deposition source that evaporates a deposition material and supplies the evaporated deposition material to the target substrate, the deposition source including:
a crucible that includes a deposition material-containing portion to accommodate the deposition material and a first flange disposed at an upper end of the deposition material-containing portion; and
a spray nozzle that includes a spray portion through which the evaporated deposition material is sprayed and a second flange disposed at a lower end of the spray nozzle to make contact with the first flange, wherein:
one of the first flange and the second flange includes a plurality of convex portions, the other one of the first flange and the second flange includes a plurality of concave portions, the plurality of convex portions and the plurality of concave portions being consecutively positioned in an entire width direction between an interior of the deposition source and ends of the first flange and the second flange, and
each of the convex portions is inserted into a corresponding concave portion such that a length of a leakage path defined between the first flange and the second flange, into which the deposition material partially enters and through which the entered deposition material moves, is longer than a distance in the width direction between an interior of the deposition source and ends of the first flange and the second flange.

7. The thin film deposition apparatus as claimed in claim 6, further including a cooling member attached to an outer surface of the first flange and the second flange.

8. The thin film deposition apparatus as claimed in claim 7, wherein the cooling member is a Peltier-effect device.

9. The thin film deposition apparatus as claimed in claim 6, further including an insulation member that wraps the deposition source.

* * * * *